(12) United States Patent
Dunsmore et al.

(10) Patent No.: US 8,301,088 B2
(45) Date of Patent: Oct. 30, 2012

(54) POLAR MODULATION TRANSMITTER WITH ENVELOPE MODULATOR PATH SWITCHING

(75) Inventors: Marnie Dunsmore, San Francisco, CA (US); Earl W. McCune, Jr., Santa Clara, CA (US); Gary Do, San Jose, CA (US)

(73) Assignee: Panasonic Corporation, Osaka (JP)

( * ) Notice: Subject to any disclaimer, the term of this patent is extended or adjusted under 35 U.S.C. 154(b) by 1052 days.

(21) Appl. No.: 12/250,104

(22) Filed: Oct. 13, 2008

(65) Prior Publication Data
US 2009/0111397 A1    Apr. 30, 2009

Related U.S. Application Data

(60) Provisional application No. 60/983,154, filed on Oct. 26, 2007.

(51) Int. Cl.
*H04B 1/66* (2006.01)
*H04B 1/04* (2006.01)
*H01Q 11/12* (2006.01)

(52) U.S. Cl. .................... 455/102; 455/127.2

(58) Field of Classification Search ........... 455/102, 455/103, 108, 110, 127.1, 127.2; 332/145, 332/149, 151
See application file for complete search history.

(56) References Cited

U.S. PATENT DOCUMENTS

| 6,738,432 | B2 | 5/2004 | Pehlke |
| 6,785,521 | B2 | 8/2004 | Hadjichristos et al. |
| 6,844,776 | B2 | 1/2005 | Schell et al. |
| 7,042,282 | B2 | 5/2006 | Schell et al. |
| 2004/0185803 | A1* | 9/2004 | Tanabe et al. ............. 455/108 |
| 2005/0277390 | A1* | 12/2005 | Ikedo et al. ............. 455/127.1 |
| 2006/0001483 | A1 | 1/2006 | Cioffi et al. |

OTHER PUBLICATIONS

John Wood et al., Rotary Traveling-Wave Oscillator Arrays: A New Clock Technology, IEEE Journal of Solid-State Circuits, vol. 36, No. 11, Nov. 2001, pp. 1654-1665.

* cited by examiner

*Primary Examiner* — Nguyen Vo

(57) ABSTRACT

Methods and apparatus for controlling power in a polar modulation transmitter. An exemplary polar modulation transmitter includes a radio frequency power amplifier (RF PA), a phase path having circuitry operable to generate a constant amplitude phase modulated signal, and an amplitude path including an envelope modulator circuit having first and second envelope modulation paths. The RF phase modulated signal is applied to an RF input of the RF PA, while an envelope modulated power supply signal generated by a selected one of the first and second envelope modulation paths is coupled to a power supply input of the RF PA. The second envelope modulation path is selected during times when the power required by the RF PA is below some predetermined power level. During times when the RF PA requires power above the predetermined power level, the first envelope modulation path is selected.

17 Claims, 6 Drawing Sheets

POLAR MODULATION TRANSMITTER WITH ENVELOPE MODULATOR PATH SWITCHING

CROSS-REFERENCE TO RELATED APPLICATIONS

This patent application claims the benefit of U.S. Provisional Patent Application No. 60/983,154, filed on Oct. 26, 2007, the disclosure of which is hereby incorporated by reference.

FIELD OF THE INVENTION

The present invention relates to wireless communications. More specifically, the present invention relates to power control in polar modulation transmitters.

BACKGROUND OF THE INVENTION

Portable wireless communication devices, such as cellular handsets, personal digital assistants (PDAs) and hand-held computers, are becoming smaller and lighter with each new generation of wireless communication technology. They are also becoming more technically sophisticated, and currently often provide or support, in addition to traditional voice communications, features such as built-in cameras, Bluetooth connectivity, text and instant messaging, and mini browsers for surfing the Internet. These additional features can severely limit the device's battery life.

To address this problem, major efforts have been directed at ways to improve the power efficiencies of these types of devices. Some of these efforts have included researching and discovering new rechargeable battery chemistries that offer longer battery life cycles. Others have focused on improving the efficiencies of the electrical circuits which use the battery's power. Because the radio frequency (RF) power amplifier (PA) output circuitry (i.e., the RF PA) in portable wireless communication devices is often the circuit that consumes the most battery power, efforts to improve circuit efficiencies have largely focused on improving the efficiency of the RF PA circuitry. Unfortunately, because conventional power amplifier circuits must operate linearly, but are not very efficient when configured to do so, improving the power efficiency of conventional RF PAs has been a very difficult problem.

Modern wireless communication standards, such as EDGE (Enhanced Data rates for GSM (Global System for Mobile Communications) Evolution) and W-CDMA (Wideband Code Division Multiple Access) employ non-constant envelope signals. To minimize distortion of these types of signals (e.g., to prevent signal peak clipping), the RF PA must be configured for linear operation. This requires the drive levels to the RF PA to be reduced, and, depending on the crest factor level of the signal (i.e., the peak amplitude of the signal divided by the root mean square (RMS) value of the signal), additional linearization resources may be required to ensure signal integrity. The immediate consequence of this linearization effort is a reduction in efficiency.

Another type of transmitter, known as a polar modulation transmitter, avoids the linearity-efficiency tradeoff of conventional power amplifiers. Because of its superior efficiency characteristics, its adaptability to different modulation schemes, and its ability to process state-of-the-art non-constant envelope communications signals, such as EDGE and W-CDMA, the polar modulation transmitter has gained widespread use in recent years.

FIG. 1 is a block diagram of a typical polar modulation transmitter 100. The polar modulation transmitter 100 comprises a symbol generator 102; a rectangular-to-polar converter 104; an envelope path including an envelope digital to analog converter (DAC) 106 and an envelope modulator circuit 108; a phase path including a phase path DAC 110 and a VCO 112; an RF PA 114; and an antenna 116.

The polar modulation transmitter 100 operates by first receiving a digital message at the symbol generator 102. Using the digital data in the digital message, the symbol generator 102 generates in-phase ('I' phase) and quadrature phase ('Q' phase) baseband signals. These I and Q baseband signals are received by the rectangular-to-polar converter 104, which, as the name suggests, converts the I and Q baseband signals into amplitude (i.e., 'envelope') and phase component signals, as indicated by the '$\rho$' and '$\theta$' symbols in FIG. 1, respectively.

The phase path DAC 110 operates to convert the phase component signal into an analog waveform, which drives the VCO 112 to create a phase modulated RF carrier signal (i.e., 'PM' signal). Meanwhile, the envelope DAC 106 operates to convert the envelope component signal (i.e., the amplitude modulation or 'AM' signal) into an analog waveform. This analog envelope component signal is coupled to the envelope modulator circuit 108, which operates to modulate a power supply voltage, $V_{BATT}$ (e.g., as provided by the wireless communication device's battery corresponding to a DC supply 118), according to variations in amplitude of the envelope signal. In this manner an amplitude modulated power supply signal, $V_S$, is created.

To generate the final modulated RF carrier signal which the antenna 116 can radiate over the air, the amplitude modulated power supply signal from the envelope path is coupled to the power supply port of the RF PA 114 while the RF PM signal is coupled to the RF input port of the RF PA 114. The RF PA 114 operates to superimpose the envelope information onto the RF signal at the output port of the RF PA 114. Because the peak amplitude of the signal into the RF PA 114 remains constant over time, the linearity concerns involving amplifying non-constant envelope signals are avoided. For this reason more efficient, non-linear RF PAs such as, for example, Class-D and E switch-mode RF PAs, can be used.

FIG. 2 is a simplified drawing illustrating how the output stage of a polar modulation transmitter may be implemented using a switch-mode RF PA. A switch-mode RF PA is formed using one or more active devices (e.g., bipolar junction or field-effect transistors). The RF phase modulated signal ('RF IN' in the drawing) is used to control the opening and closing of a switch-mode RF PA 114. As described above, the envelope portion of the baseband signal (i.e., the 'AM' signal) is used by the envelope modulator circuit 108 to amplitude modulate the DC supply 118, which usually comprises the rechargeable battery of an associated wireless communications device.

Typically, the battery voltage, $V_{BATT}$, provided by the DC supply 118 is about 3 to 3.5 volts (up to around 4.2 volts when fully charged). Yet cellular networks, such as the widely deployed GSM cellular network, require output powers of 3 Watts or higher. Given this large output power, but limited supply voltage, and that the power consumed by the RF PA is proportional to the square of the amplitude of the amplitude modulated power supply voltage, $V_S$, applied to it, it is important that only a small portion of the battery voltage, $V_{BATT}$, be allowed to drop across the envelope modulator circuit 108.

FIG. 3 is a drawing of a prior art envelope modulator circuit 108 which is commonly used to maximize the transfer of the modulated battery voltage to the RF PA (represented by a load resistance 114 having a resistance, $R_{PA}$, in the drawing). The envelope modulator circuit 108 comprises an operational amplifier (op-amp) 302 configured as an inverting amplifier that drives the base of a p-n-p bipolar junction transistor (BJT) 304. During times when the power required of the RF PA 114 is high, the p-n-p BJT 304 is configured so that it operates near saturation. When operating near saturation the collector-emitter voltage $V_{CE}(\text{sat})$ of the p-n-p BJT 304 is only on the order of about 0.1 volts. Consequently, most of the available battery supply voltage, $V_{BATT}$, is made available at the power supply port of the RF PA 114 and not dropped across the envelope modulator circuit 108. In other words, $V_S = V_{BATT} - V_{CE}(\text{sat}) \cong V_{BATT}$.

While the envelope modulator circuit 108 in FIG. 3 does work efficiently when the RF PA 114 must provide high output powers, it does have various drawbacks when only low output power levels are needed. These drawbacks relate in particular to use of the p-n-p type BJT 304, which when operating at low powers can be susceptible to noise. This susceptibility to noise is highly undesirable, since noise can cause distortions in the RF output signal of the RF PA 114.

The p-n-p BJT 304, particularly when combined with the inverting op-amp of the envelope modulator circuit of FIG. 3, also presents stability concerns. Variation in the amplitude of the AM signal applied to the input of the op-amp 302 can cause wide variations in the transistor collector current, $I_C$. This wide variation in collector current demands a corresponding wide variation in closed loop gain of the amplifier. However, the gain of practical op-amps is frequency dependent, and decreases and approaches unity as the frequency of its input signal (in this case, the AM signal) increases. The phase shift between the AM signal and the signal fed back to the noninverting input of the op-amp 302 also increases towards 180° as the frequency of the AM signal increases. When the phase shift reaches 180° the amplifier can become unstable and can even begin to oscillate. Oscillations render the amplifier circuit unsuitable for its intended purpose, since, during oscillations, the output of the amplifier bears no relationship to the AM signal applied to the amplifier's input. Therefore, in addition to the problem of being susceptible to noise at low output power levels, the envelope modulator circuit 108 in FIG. 3 is beset with stability concerns which limit the modulator's dynamic range.

Given the foregoing restrictions and limitations of the prior art, it would be desirable to have methods and apparatus for superimposing envelope information onto RF phase modulated signals in polar modulation transmitters that are efficient, stable, resistant to noise, and which are operable over wide dynamic ranges.

SUMMARY OF THE INVENTION

Methods and apparatus for controlling power in a polar modulation transmitter are disclosed. An exemplary polar modulation transmitter includes a radio frequency power amplifier (RF PA), a phase path having circuitry operable to generate a constant amplitude phase modulated signal, and an amplitude path including an envelope modulator circuit having first and second envelope modulation paths. The RF phase modulated signal is applied to an RF input port of the RF PA, while an envelope modulated power supply signal generated by a selected one of the first and second envelope modulation paths is coupled to a power supply input of the RF PA. According to one aspect of the invention, the first envelope modulation path is selected during times when the power required by the RF PA is above some predetermined power level. During times when the RF PA requires power below the predetermined power level, the second envelope modulation path is selected.

In an exemplary embodiment, the first envelope modulation path includes a p-n-p bipolar junction transistor (BJT), the second envelope modulation path includes an n-p-n BJT, and the predetermined threshold is set so that the first envelope modulation path is selected only at the highest powers required of the RF PA, or when the desired output power is very close to the available supply. When the first envelope modulation path is selected, the p-n-p BJT is employed to provide the envelope modulated supply signal to the power supply input of the RF PA. Use of the p-n-p BJT allows the voltage drop across the envelope modulator circuit to be minimized, which is particularly important at high output power levels. For times when the power is below the predetermined threshold, the second envelope modulation path is selected. When the second envelope modulation path is selected, the n-p-n BJT is employed to provide the envelope modulated supply signal to the power supply input of the RF PA. Use of the n-p-n BJT at these relatively lower power levels affords improved stability and noise isolation. Hence, switching between the first and second envelope modulation paths, depending on the power requirements of the RF PA, provides greater stability and dynamic range, while still offering efficient power transfer at higher power levels.

According to one aspect of the invention, the envelope modulator circuit may be adapted to include a DC-to-DC converter that lowers the supply voltage provided to the second envelope modulation path when the second envelope modulation path is selected (i.e., when the n-p-n BJT is ON and the p-n-p BJT is OFF). Lowering the supply voltage substantially reduces the power dissipated by the n-p-n BJT as the n-p-n BJT transfers the envelope modulated supply signal to the power supply input of the RF PA.

Further aspects of the invention are described and claimed below, and a further understanding of the nature and advantages of the invention may be realized by reference to the remaining portions of the specification and the attached drawings.

DETAILED DESCRIPTION

Those of ordinary skill in the art will realize that the following detailed description of the present invention is illustrative only and is not intended to be in any way limiting.

Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

Figure 4:
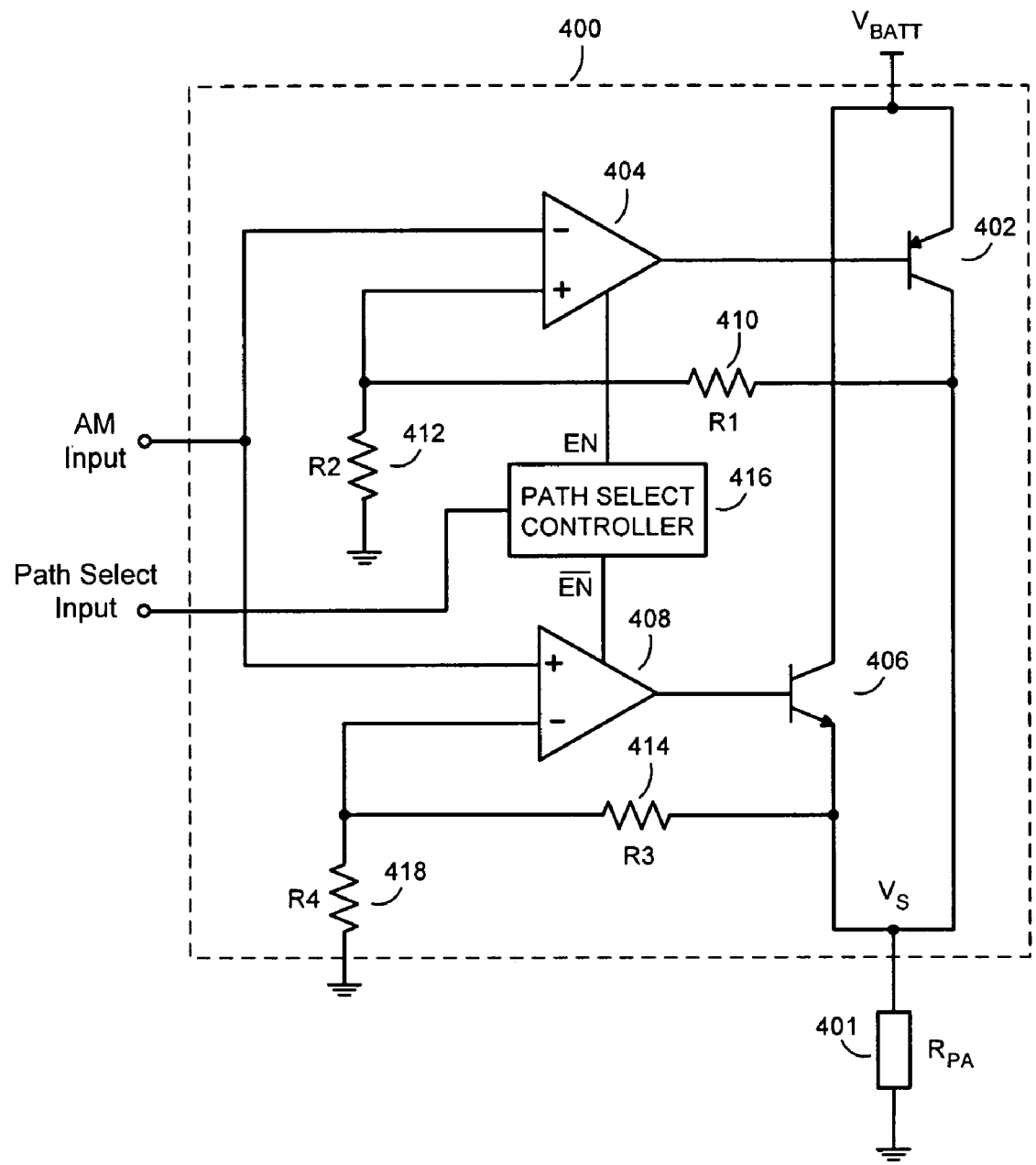
FIG. 4 is a drawing of an envelope modulator circuit, according to an embodiment of the present invention.

Referring first to FIG. 4, there is shown an envelope modulator circuit 400 for use in the amplitude path of a polar modulation transmitter, in accordance with an embodiment of the present invention. The envelope modulator circuit 400 comprises first and second parallel power supply paths selectively configured to supply power to the power supply port of an RF PA (represented as a load 401 having a resistance, $R_{PA}$, in the drawing). The first power supply path includes a p-n-p bipolar junction transistor (BJT) 402 having a control input (i.e., base) coupled to an output of a first op-amp 404. The second power supply path includes an n-p-n BJT 406 having a control input coupled to an output of a second op-amp 408. While BJTs are used in this exemplary embodiment, those of ordinary skill in the art will readily appreciate and understand that other types of devices (e.g. other types of active devices like field-effect transistors) may be alternatively used.

The emitter of the p-n-p BJT 402 in the first power supply path is coupled to a power supply (e.g., a rechargeable battery) that supplies a DC voltage, $V_{BATT}$. The voltage at the collector of the p-n-p BJT 402 is fed back to the noninverting input of the first op-amp 404, via a first feedback resistor (R1) 410, and is coupled to a power supply port of the RF PA 401. A first bias resistor (R2) 412 is also coupled to the noninverting input of the first op-amp 404.

Similarly, the collector of the n-p-n BJT 406 in the second power supply path is coupled to $V_{BATT}$. The voltage at the emitter of the n-p-n BJT 406 is fed back to the inverting input of the second op-amp 408, via a second feedback resistor (R3) 414, and is coupled to the power supply port of the RF PA 401. A second bias resistor (R4) 418 is also coupled to the inverting input of the second op-amp 408.

According to an aspect of the invention, only one of the first and second op-amps, 404 or 408, is operational at any given time. Which of the two op-amps, 404 or 408, is selected for operation is determined by enablement signals EN and $\overline{\text{EN}}$ provided by a path select controller 416 (i.e., path selection circuit) to enable/disable inputs of the first and second op-amps 404, 408. The path select controller 416 may be provided outside the envelope modulator circuit 400.

When the enablement signals EN and $\overline{\text{EN}}$ have values that select the first op-amp 404, the associated p-n-p BJT 402 operates to modulate the battery voltage, $V_{BATT}$, according to changes in the amplitude of the AM signal (i.e., the envelope portion of the baseband signal) applied to inverting input of the first op-amp 404. By modulating the battery voltage a modulated supply voltage, $V_S$, is generated. This modulated supply voltage, $V_S$, is coupled to the power supply port of the RF PA 401, while the phase modulated signal is being applied to the RF input of the RF PA 401. The RF PA 401, which is configured to operate in compression, then operates to impress the amplitude information onto the RF phase modulated signal.

Conversely, when the enablement signals EN and $\overline{\text{EN}}$ have values that select the second op-amp 408, the n-p-n BJT 406 operates to modulate the battery voltage, $V_{BATT}$, according to changes in the amplitude of the AM signal applied to noninverting input of the second op-amp 408, thereby generating and providing the modulated supply voltage, $V_S$, for the RF PA 401.

According to one embodiment of the invention, the first op-amp 404 and associated p-n-p BJT 402 in the first path of the envelope modulator circuit 400 are enabled (i.e., 'selected') during times when only the highest output powers of the RF PA 401 are needed (e.g., when maximizing the transfer of the modulated power supply voltage to the power supply port of the RF PA is of primary concern, or when the power required by the RF PA increases above a predetermined power threshold, or when the amplitude of the envelope signal increases above a predetermined threshold). At all other times, the second op-amp 408 and associated n-p-n BJT 406 in the second path are enabled. In general, n-p-n BJTs are less susceptible to noise and more stable than p-n-p BJTS. In contrast, when controlled by an op-amp in the manner described above, the p-n-p BJT 402 is generally more power efficient at transferring power to the RF PA 401 than is the n-p-n BJT 406, particularly when the RF PA is transmitting at higher output powers. Accordingly, switching the envelope modulation between the two parallel paths provides higher noise immunity and increased stability compared to prior art approaches, while continuing to efficiently provide modulated power supply voltages to the RF PA 401. Another benefit of using the n-p-n BJT 406 at all but the highest powers is that it avoids the need for a boost supply, which might otherwise be needed to overcome the supply voltage dropped across the modulator circuitry at higher power levels if the p-n-p BJT 402 was not available at higher power levels.

The boundary defining which of the two envelope modulation paths is selected can be determined and established in various ways. For example, it can be set based on past, present, or expected transmission power levels of the RF PA; on the amplitude of the AM signal applied to the first and second op-amps, 404, 408; on design specifications of the envelope modulator circuit; or on transmit power control commands received from an external power controlling apparatus such as a cellular base station, via a local baseband processor of the associated mobile device.

Figure 1:
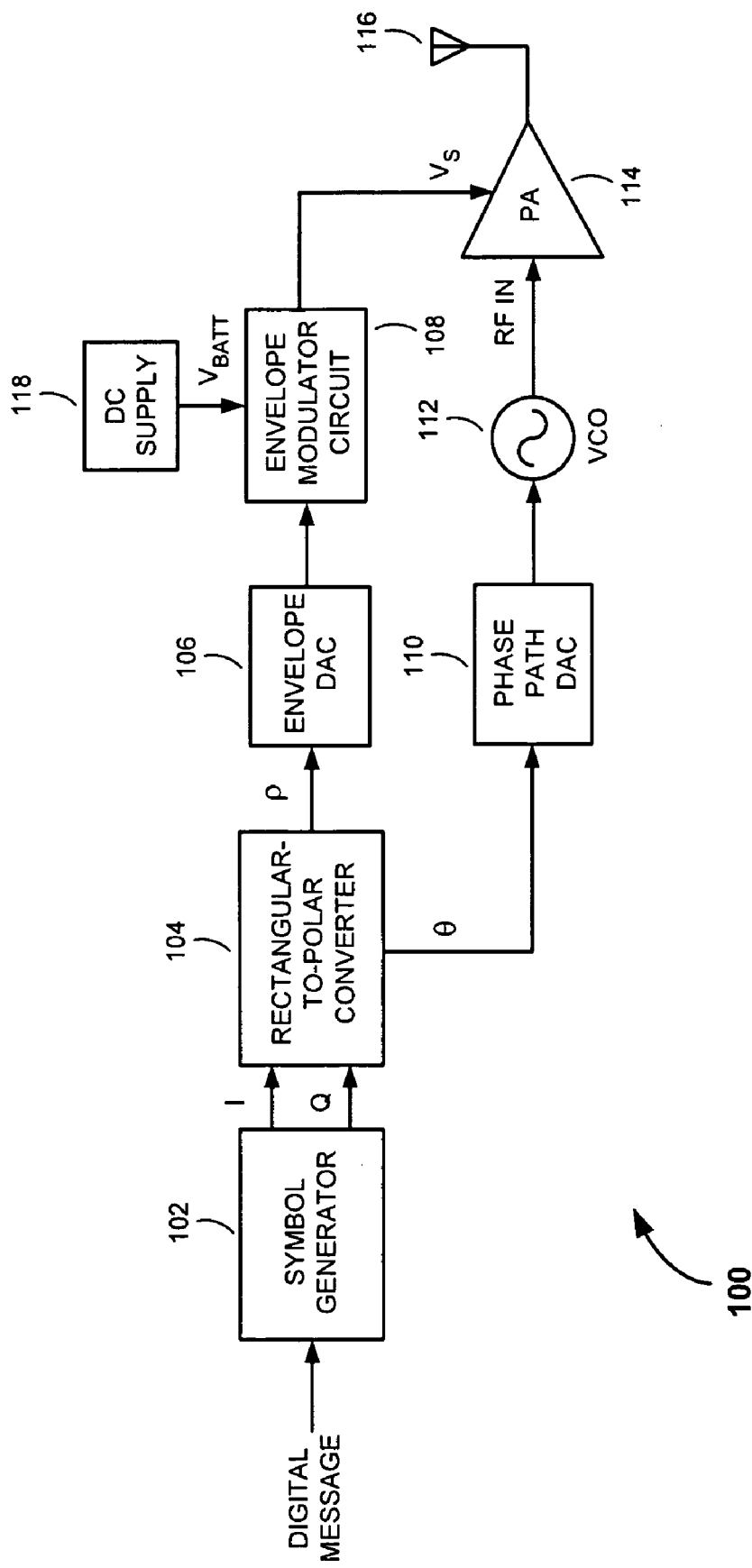
FIG. 1 is a block diagram of a typical polar modulation transmitter.
Figure 2:
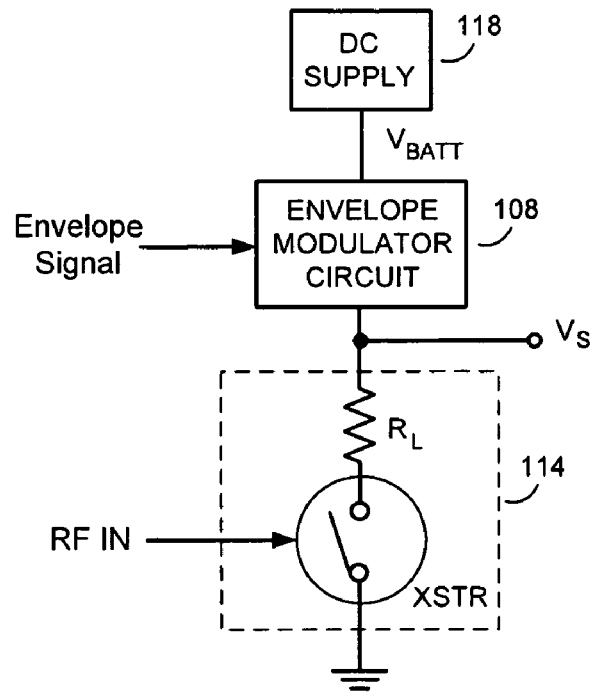
FIG. 2 is a drawing illustrating how the output stage of a polar modulation transmitter may be implemented using a switch-mode radio frequency power amplifier (RF PA)
Figure 3:
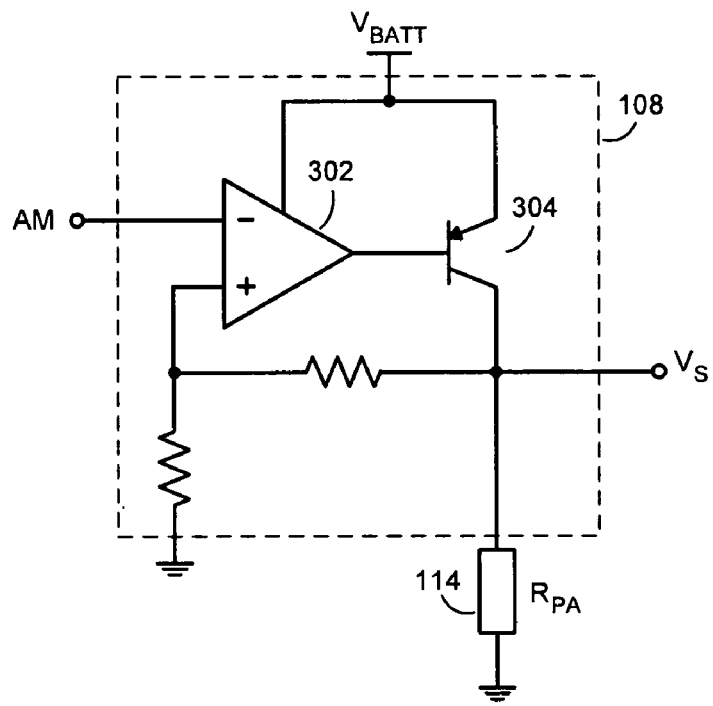
FIG. 3 is a drawing of a prior art envelope modulator circuit, which is commonly used in the envelope path of a polar modulation transmitter.
Figure 5:
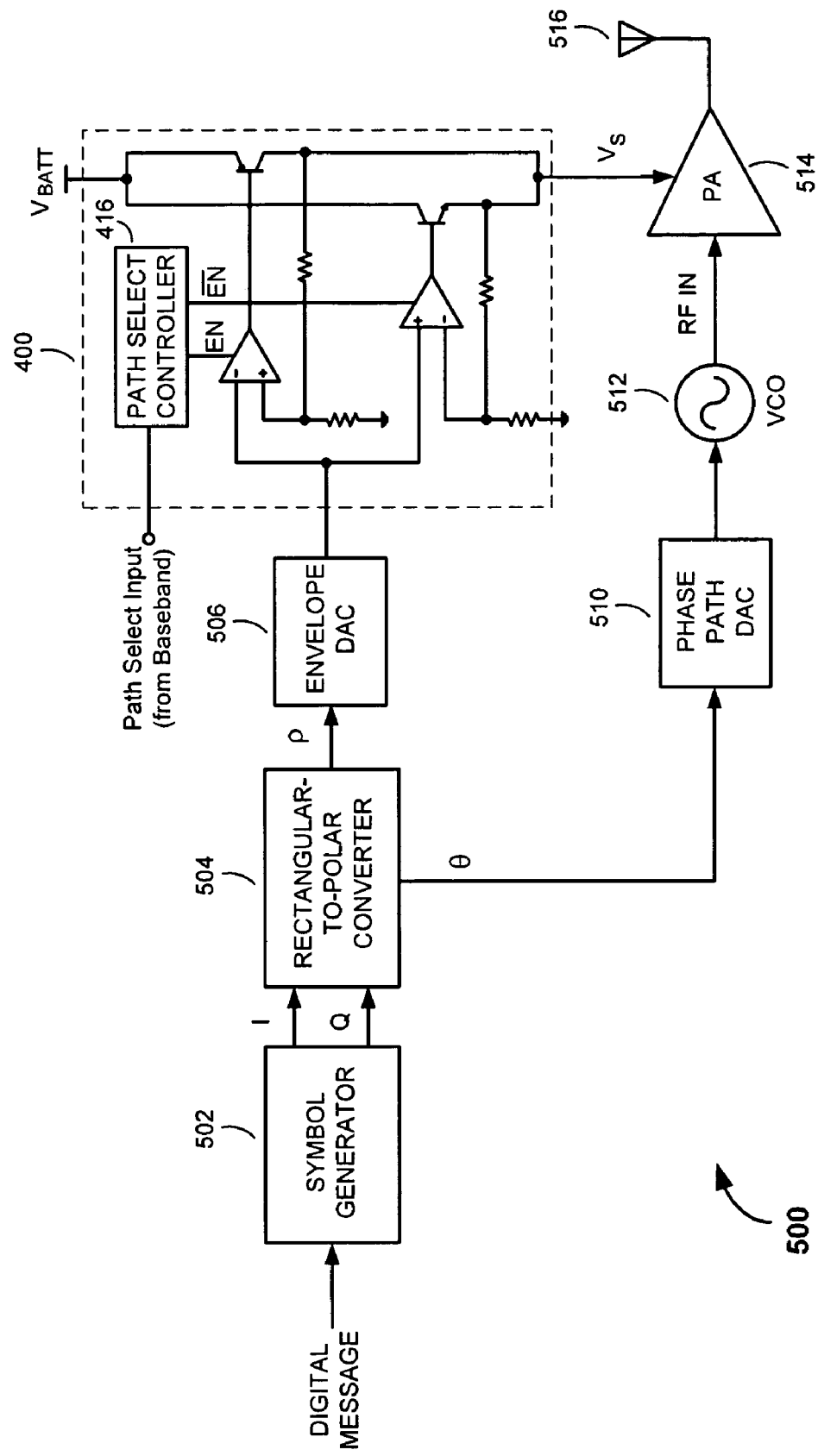
FIG. 5 is a drawing of a polar modulation transmitter adapted to include the envelope modulator circuit in FIG. 4, according to an embodiment of the present invention.

FIG. 5 is a drawing illustrating how the envelope modulator circuit 400 in FIG. 4 may be configured in a polar modulation transmitter 500, according to an embodiment of the present invention. The polar modulation transmitter 500 comprises a symbol generator 502; a rectangular-to-polar converter 504; an envelope path including an envelope digital to analog converter (DAC) 506 and the envelope modulator circuit 400; a phase path including a phase path DAC 510 and a VCO 512; an RF PA 514; and an antenna 516. The polar modulation transmitter 500 operates similar to the polar modulation transmitter 100 described in FIG. 1 above, except that the envelope modulator circuit 400 having two parallel and selectable power supply paths between the supply voltage ($V_{BATT}$) and the power supply port of the RF PA 514 is used. Which of the two paths is selected is determined by which of the two op-amps of the modulator circuit 400 is enabled by the path select controller 416, similar to as was described above.

Figure 6:
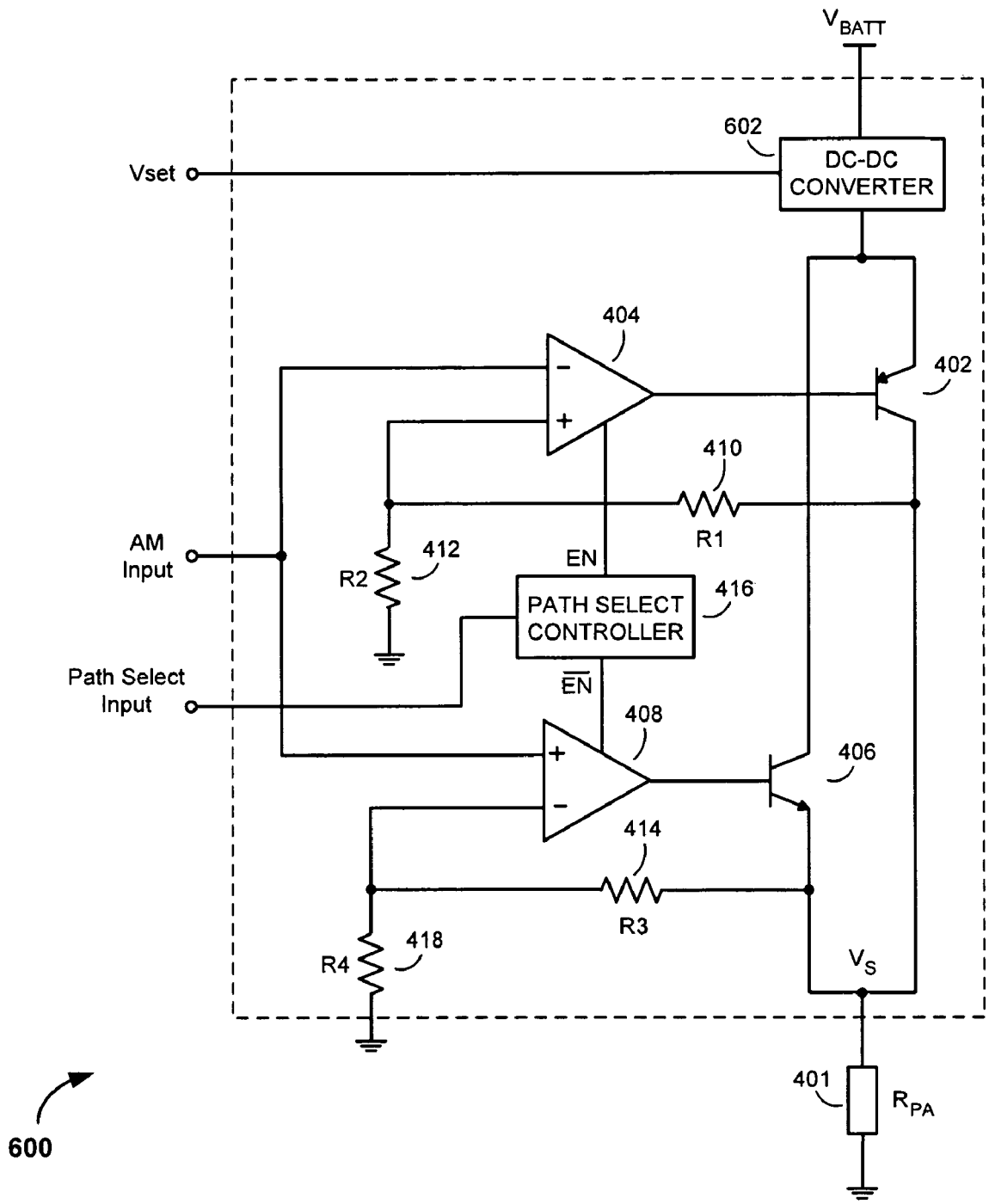
FIG. 6 is a drawing of an envelope modulator circuit, according to an embodiment of the present invention.

Referring now to FIG. 6, there is shown an envelope modulator circuit 600, according to another embodiment of the present invention. The envelope modulator circuit 600 is similar to the envelope modulator circuit 400 described and shown in FIG. 4 above, except that the envelope modulator circuit 600 in FIG. 6 further includes a DC-to-DC converter 602 coupled between the battery supply voltage, $V_{BATT}$, and the two selectable power supply paths. The DC-to-DC converter 602 has a voltage setting input configured to receive a voltage output setting signal, Vset. The DC-to-DC converter 602 is operable to convert the battery supply voltage, $V_{BATT}$, to an output voltage determined by the value of the voltage output setting signal, Vset.

Figure 7:
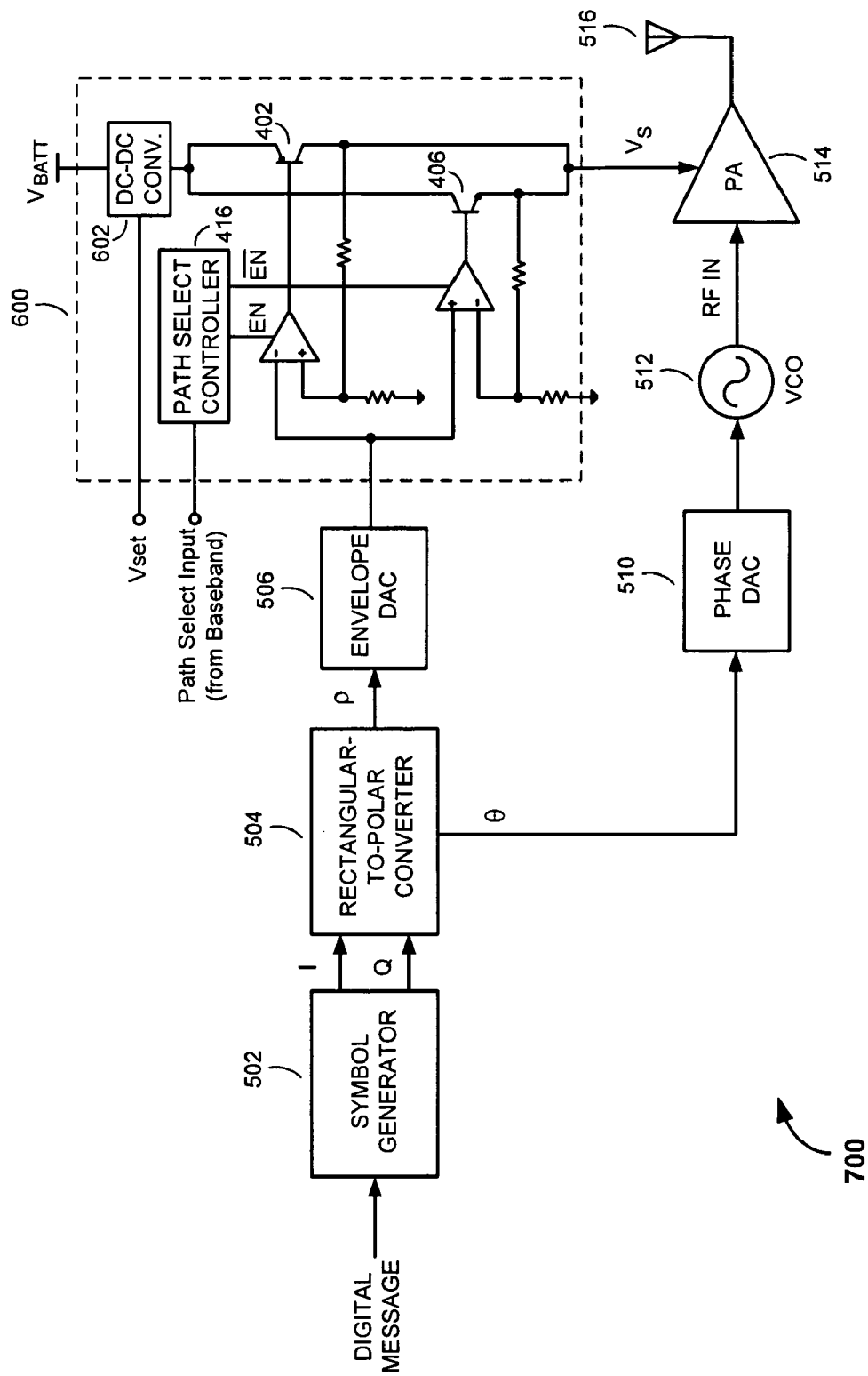
FIG. 7 is a drawing of a polar modulation transmitter adapted to include the envelope modulator circuit in FIG. 6, according to an embodiment of the present invention.

FIG. 7 illustrates how the modified envelope modulator circuit 600 in FIG. 6 is configured in a polar modulation transmitter 700, according to an embodiment of the present invention. According to this embodiment, the voltage output setting signal, Vset, is used to lower the supply voltage from $V_{BATT}$ to a lower voltage during times when the RF PA 514 is to transmit at lower output power levels, i.e., during times when the n-p-n BJT 406 is ON and the p-n-p BJT 402 is turned OFF. The voltage output setting signal, Vset, can be the same select signal used to control the path select controller 416, a separate baseband control signal, or some other external control signal. Lowering the supply voltage using the DC-to-DC converter 602 during times when the n-p-n BJT 406 is ON substantially reduces the power dissipated by the n-p-n BJT 406, as the n-p-n BJT 406 transfers the modulated supply voltage, $V_S$, to the power supply port of the RF PA 514.

While the above is a complete description of the preferred embodiments of the invention sufficiently detailed to enable those skilled in the art to build and implement the system, it should be understood that various changes, substitutions, and alterations may be made without departing from the spirit and scope of the invention as defined by the appended claims.

What is claimed is:

1. A polar modulation transmitter, comprising:
    a radio frequency power amplifier (RF PA) having a power supply port, an RF input port, and an RF output port;
    a phase path having circuitry operable to generate and provide a constant amplitude phase modulated signal to the RF input port of the RF PA; and
    an amplitude path including an envelope modulator circuit configured to receive an envelope signal and to include first and second envelope modulation paths selectively configurable between a power supply and the power supply port of the RF PA;
    wherein the first envelope modulation path includes a first active device and the second envelope modulation path includes a second active device;
    wherein the first active device comprises a p-n-p bipolar junction transistor (BJT) and the second active device comprises an n-p-n BJT.

2. The polar modulation transmitter of claim 1, further comprising a path selection circuit coupled to the envelope modulator circuit operable to determine which of said first and second envelope modulation paths is configured between the power supply and the power supply port of the RF PA.

3. The polar modulation transmitter of claim 2 wherein which of the first and second envelope modulation paths the path selection circuit selects depends on a transmit power control command received from an external power controlling apparatus.

4. The polar modulation transmitter of claim 1 wherein the envelope modulator circuit further includes first and second op-amps configured to receive the envelope signal and selectively configured to provide an amplified envelope signal to either a control input of the first active device or to a control input of the second active device.

5. The polar modulation transmitter of claim 4, further comprising a path selection circuit coupled to the envelope modulator circuit operable to enable one of the first and second op-amps and disable the other of the first and second op-amps.

6. The polar modulation transmitter of claim 5 wherein the path selection circuit is operable to enable the first op-amp for times when the output power required of the RF PA is to be transmitted at a power level within a first power output range and operable to enable the second op-amp for times when the output power required of the RF PA is to be transmitted at a power level within a second power output range.

7. The polar modulation transmitter of claim 1 wherein the envelope modulator circuit further includes a voltage converter configured to provide a first supply voltage to a terminal of the first active device during a time when the first envelope modulation path is selected and a second supply voltage to the second active device during a time when the second envelope modulation path is selected.

8. A radio frequency (RF) transmitter, comprising:
    a radio frequency power amplifier (RF PA) having a power supply port, an RF input port configured to receive an RF input signal, and an RF output port configured to provide a modulated RF output signal;
    a power control circuit having first and second power supply paths that are selectively configurable between a power supply and the power supply port of the RF PA; and
    a path selection circuit operable to select which of the first and second power supply paths is configured between the power supply and the power supply port of the RF PA;
    wherein the path selection circuit is operable to select the first power supply path during times when the output power of the RF PA is required to be within a first output power range, and select the second power supply path during times when the output power of the RF PA is required to be within a second output power range.

9. The RF transmitter of claim 8 wherein the power control circuit comprises an amplitude modulator circuit configured to receive an amplitude varying signal and to include the first and second power supply paths including first and second active devices configured to modulate a power supply signal provided by the power supply.

10. The RF transmitter of claim 9 wherein the first power supply path is selected to maximize the transfer of the modulated power supply signal to the power supply port of the RF PA, and the second power supply path is selected to minimize the RF transmitter's susceptibility to noise or to increase the dynamic range of the RF transmitter.

11. The RF transmitter of claim 8 wherein the power control circuit includes a voltage converter coupled between said power supply and the first and second power supply paths, said voltage converter operable to provide a first supply voltage to said first power supply path when the first power supply path is selected and provide a second supply voltage to said second power supply path when the second power supply path is selected.

12. A method of controlling power in a polar modulation transmitter, comprising:
    generating a radio frequency (RF) phase modulated signal from a phase signal containing phase information of a communications signal;
    applying the RF phase modulated signal to an RF input of an RF power amplifier (RF PA);
    selecting a power supply path from among a plurality of power supply paths that are each individually and separately configurable between a power supply and a power supply input of the RF PA;
    modifying one or more electrical characteristic of the selected power supply path according to amplitude variations in an envelope signal containing envelope information of said communications signal, to generate an envelope modulated power supply signal; and applying the envelope modulated power supply signal to the power supply input of the RF PA;

wherein selecting a power supply path from among a plurality of power supply paths comprises switching from a first selected power supply path to a second power supply path when the power required by the RF PA reduces below a predetermined power threshold.

13. The method of claim 12 wherein selecting a power supply path from among a plurality of power supply paths comprises switching from the first selected power supply path to the second power supply path, in response to a transmit power control command.

14. The method of claim 12 wherein selecting a power supply path from among a plurality of power supply paths comprises switching from the first selected power supply path to the second power supply path when the amplitude of the envelope signal reduces below a predetermined threshold.

15. The method of claim 12 wherein selecting a power supply path from among a plurality of power supply paths comprises switching from the first selected power supply path to the second power supply path, said first selected power supply path including a first active device and said second power supply path including a second active device.

16. The method of claim 15, further comprising:
coupling a first power supply voltage to said first active device during a time when said first selected power supply path is selected; and
coupling a second power supply voltage to said second active device during a time when said second power supply path is selected.

17. The method of claim 16 wherein the second power supply voltage is less than the first power supply voltage.

* * * * *